(12) United States Patent
Takenouchi

(10) Patent No.: US 7,842,193 B2
(45) Date of Patent: Nov. 30, 2010

(54) POLISHING LIQUID

(75) Inventor: Kenji Takenouchi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 918 days.

(21) Appl. No.: 11/528,562

(22) Filed: Sep. 28, 2006

(65) Prior Publication Data
US 2007/0093187 A1 Apr. 26, 2007

(30) Foreign Application Priority Data
Sep. 29, 2005 (JP) .............................. 2005-285433

(51) Int. Cl.
*C09K 13/06* (2006.01)
(52) U.S. Cl. ................. 252/79.4; 252/79.1; 252/79.2; 252/79.3; 438/625; 438/645; 438/692
(58) Field of Classification Search ....... 252/79.1–79.4, 252/79; 438/625, 645, 692
See application file for complete search history.

(56) References Cited

U.S. PATENT DOCUMENTS

| | | | |
|---|---|---|---|
| 6,773,476 B2 * | 8/2004 | Sakai et al. ................... 51/307 |
| 7,037,352 B2 * | 5/2006 | Ito et al. ........................ 51/307 |
| 7,300,480 B2 * | 11/2007 | Bian et al. ..................... 51/307 |
| 7,442,645 B2 * | 10/2008 | Carter et al. ................ 438/690 |
| 2005/0173669 A1 * | 8/2005 | Kurata et al. ............... 252/79.1 |

FOREIGN PATENT DOCUMENTS

| | | |
|---|---|---|
| JP | 2000-84832 A | 3/2000 |
| JP | 2003-17446 A | 1/2003 |
| JP | 2003-142435 A | 5/2003 |

* cited by examiner

*Primary Examiner*—Lan Vinh
*Assistant Examiner*—Maki A Angadi
(74) *Attorney, Agent, or Firm*—Sughrue Mion, PLLC

(57) ABSTRACT

According to an aspect of the invention, there is provided a polishing liquid for polishing a barrier metal material on an interlayer insulation material, the polishing liquid having a pH of from 2.0 to 6.0 and including an aqueous solution containing a compound represented by the following formula (1), and polishing particles containing silicon oxide and dispersed in the aqueous solution: $R^1—(CH_2)_m—(CHR^2)_n—COOH$ (1) wherein $m+n \leq 4$; $R^1$ represents a hydrogen atom, a methyl group, an ethyl group or a hydroxyl group; $R^2$ represents a methyl group, an ethyl group, a benzene ring or a hydroxyl group; and when a plurality of $R^2$s are present in the formula (1), they are the same or different from one another.

8 Claims, No Drawings

POLISHING LIQUID

CROSS-REFERENCE TO RELATED APPLICATION

This application claims priority under 35 USC 119 from Japanese Patent Application No. 2005-285433, the disclosure of which is incorporated by reference herein.

The Japanese counterpart application of this application is Japanese Patent Application No. 2006-182544, the disclosure of which is incorporated by reference herein.

BACKGROUND OF THE INVENTION

1. Field of the Invention

The present invention relates to a polishing liquid which is used for producing a semiconductor device, and in particular to a polishing liquid which is favorably used for polishing barrier metal materials for flattening in a wiring process of a semiconductor device.

2. Description of the Related Art

In the development of semiconductor devices such as semiconductor integrated circuits (referred to as LSIs hereinafter), higher density and higher integration by fine and laminated wiring lines have been required in recent years for miniaturization and high speed processing of the devices. One of various technologies used for this purpose is chemical mechanical polishing (referred to as CMP hereinafter). CMP is an essential technology for flattening the surface of a film to be processed such as an interlayer insulation film, for forming plugs and for forming embedded metal wiring, and is performed for smoothening a substrate, for removing excess metal thin films when forming wiring lines and for removing excess barrier layers on an insulation film.

In a usual method of CMP, a polishing pad is attached on a circular polishing platen, the surface of the polishing pad is impregnated with a polishing liquid, the surface of a substrate (wafer) is pressed onto the surface of the polishing pad, both the polishing platen and substrate are allowed to rotate while a predetermined pressure is applied at the back face of the substrate, and the surface of the substrate is flattened by a mechanical friction that is generated.

While fine wiring lines are formed in multilayer form for producing a semiconductor device such as an LSI, barrier metals such as Ta, TaN, Ti and TiN are formed in advance for preventing wiring materials from diffusing into the interlayer insulation films and for improving adhesiveness of the wiring materials when metal wiring lines such as Cu lines are formed in each layer.

In a conventional process for forming each wiring layer, CMP of metal films (referred to as metal film CMP hereinafter) for removing excess wiring materials heaped by plating is performed one or several times, and CMP for removing barrier metal materials (barrier metals) thus exposed on the surface (referred to as barrier metal CMP hereinafter) is subsequently performed. However, there are problems in that wiring portions are excessively polished by metal film CMP, which is called dishing, and further erosion is caused.

For reducing this dishing, in barrier metal CMP which is subsequently performed, it is required to adjust the polishing speed of the metal wiring portions and the polishing speed of the barrier metal portions, to thereby ultimately form wiring layers having fewer concavities due to dishing and erosion. In other words, since the wiring portions are rapidly polished to cause dishing and erosion when the polishing speeds of the barrier metal and interlayer insulation film are smaller than the polishing speed of the metal wiring material in barrier metal CMP, it is desirable that the barrier metal and insulation film layer have an appropriately higher polishing speed. This is not only because there is an advantage of enhancing the throughput of barrier metal CMP, but also because substantially dishing is often caused by metal film CMP and thus it is required to relatively enhance the polishing speeds of the barrier metal and insulation layer as mentioned above.

Various studies of polishing liquids have been made as follows.

While a CMP polishing agent and a polishing method for high speed polishing with little generation of scratches (for example Japanese Patent Application Laid-Open (JP-A) No. 2003-17446), a polishing composition and polishing method for improving cleanablity in CMP (JP-A No. 2003-142435), and a polishing composition for preventing polishing particles from aggregating (JP-A No. 2000-84832) have been proposed, it is necessary in the above-mentioned polishing liquids to appropriately control the ratio of the polishing speeds of the barrier metal layer and insulation film layer to the polishing speed of the metal wiring material, to thereby make the final concavities due to dishing and erosion as small as possible.

SUMMARY OF THE INVENTION

The present invention has been made in view of the above circumstances and provides a polishing liquid.

According to an aspect of the invention, there is provided a polishing liquid for polishing a barrier metal material on an interlayer insulation material, the polishing liquid having a pH of from 2.0 to 6.0 and comprising an aqueous solution containing a compound represented by the following formula (1), and polishing particles containing silicon oxide and dispersed in the aqueous solution:

$$R^1-(CH_2)_m-(CHR^2)_n-COOH \qquad (1)$$

wherein m+n≦4; $R^1$ represents a hydrogen atom, a methyl group, an ethyl group or a hydroxyl group; $R^2$ represents a methyl group, an ethyl group, a benzene ring or a hydroxyl group; and when a plurality of $R^2$s are present in the formula (1), they are the same or different from one another.

DETAILED DESCRIPTION OF THE INVENTION

It is an object of the invention to provide a polishing liquid excellent in stability without forming gels after long-term storage, wherein the polishing speeds and polishing selection ratio of the metal wiring material, barrier material and insulation material can be appropriately controlled to reduce dishing in CMP of the barrier metal material which is performed after bulk polishing of the metal wiring in producing a semiconductor device.

The invention can provide a polishing liquid excellent in dispersion stability of polishing particles, wherein the polishing speeds of the barrier metal layer, insulation film layer and the metal wiring material can be appropriately controlled to reduce the final concavities due to dishing and erosion.

Specific embodiments of the invention will be described below.

The polishing liquid of the invention is a polishing slurry comprising at least a monocarboxylic acid having a specific chemical formula and silicon oxide particles as polishing particles, and having a pH of from 2.0 to 6.0.

Aggregation of solid substances contained in the polishing liquid in a short period of time, and gelation of the polishing liquid by remarkable aggregation may be prevented by maintaining the pH of the polishing liquid in the above-mentioned range and by adjusting electric conductivity preferably to 10 mS/cm or less, and stable dispersion of the solid substance in the polishing liquid can be maintained for a long period of time.

The electric conductivity of the polishing liquid is preferably 10 mS/cm or less, more preferably 0.2 to 8.0 mS/cm, and still more preferably 0.2 to 7.0 mS/cm.

The solid substance may be aggregated when the electric conductivity is high. This is thought to be because due to increase in the ionic strength of the polishing liquid, electric double layers of the particles contained in the polishing liquid is compressed to permit the particles to readily contact to one another. Accordingly, the electric conductivity is preferably maintained in the above-mentioned range from the viewpoint of stability of the polishing liquid.

The electric conductivity can be controlled by the addition amounts of the above-mentioned carboxylic acid and a pH control agent such as acids and alkalies.

The electric conductivity in the invention is an electric conductivity of a polishing liquid in which solid substances such as particles are removed by filtration or the like, and is measured using a commercially available electric conductivity measurement apparatus (such as DS-52 manufactured by Horiba Co., Ltd.).

Components contained in the polishing liquid of the invention will be described below.

The polishing liquid of the invention may contain components other than the substances listed below, according to the purpose.

[Monocarboxylic Acid]

The monocarboxylic acid used in the invention is represented by the following formula (1):

$$R^1—(CH_2)_m—(CHR^2)_n—COOH \quad (1)$$

In the formula (1), $m+n \leq 4$; $R^1$ represents a hydrogen atom, methyl group, ethyl group or hydroxyl group; and $R^2$ represents a methyl group, ethyl group, benzene ring or hydroxyl group. When a plurality of $R^2$s are present, they may be the same or different from each other.

Preferable specific examples of the compound represented by the formula (1) include lactic acid, glycolic acid, acetic acid, propionic acid, butyric acid, methyl valeric acid, capronic acid and mandelic acid.

While the compounds represented by the formula (1) may be synthesized by known methods, commercially available products may be used.

Two kinds of different compounds represented by the formula (1) may be used together. While the mass ratio of the two compounds may be arbitrarily selected in the range from 100/1 to 1/100, a preferable range is from 10/1 to 1/10.

The total addition amount of the compound represented by the formula (1) is preferably in the range from 0.0005 to 3 moles, more preferably in the range from 0.01 to 0.5 moles, in 1 L of the polishing liquid used for polishing.

Components contained in known CMP polishing liquids are preferably contained in the polishing liquid of the invention in addition to the above-mentioned compounds. These components will be described below.

[Passivated Film Forming Agent]

The polishing liquid of the invention may contain at least one heterocyclic compound as a compound for forming a passive film on the surface of the metal to be polished.

The heterocyclic compound as used herein is a compound having a heterocyclic ring having at least one hetero-atom. The hetero-atom means an atom except the carbon atom and hydrogen atom. The heterocyclic ring means a ring having at least one hetero-atom. The hetero-atom refers to an atom forming cyclic portions of the ring system of the heterocyclic ring, and does not mean an atom that is located at the outside of the ring system, is separated from the ring system by at least one non-conjugated single bond, or is a part of additional substituents of the ring system.

The hetero-atom is preferably nitrogen atom, sulfur atom, oxygen atom, selenium atom, tellurium atom, phosphor atom, silicon atom and boron atom, more preferably nitrogen atom, sulfur atom, oxygen atom and selenium atom, further more preferably nitrogen atom, sulfur atom and oxygen atom, and most preferably nitrogen atom and sulfur atom.

The number of the ring-forming atoms of the heterocyclic ring of the heterocyclic compound is not particularly restricted, and the compound may be a monocyclic compound or a polycyclic compound having condensed rings. The number of the atoms constituting the ring of the monocyclic compound is preferably in the range from 5 to 7, and particularly preferable number is 5. The number of the rings when the compound has condensed rings is preferably 2 or 3.

Specific examples of the heterocyclic ring include the following rings, but are not restricted thereto.

Examples of the heterocyclic ring include pyrrole ring, thiophene ring, furan ring, pyran ring, thiopyran ring, imidazole ring, pyrazole ring, thiazole ring, isothiazole ring, oxazole ring, isooxyazole ring, pyridine ring, pyrazine ring, pyrimidine ring, pyridazine ring, pyrrolidine ring, pyrazolidine ring, imidazolidine ring, isoxazolidine ring, isothiazolidine ring, piperidine ring, piperazine ring, morpholine ring, thiomorpholine ring, chromane ring, thiochromane ring, isochromane ring, isothiochromane ring, indoline ring, isoindoline ring, pyrindine ring, indolizine ring, indole ring, indazole ring, purine ring, quinolizine ring, isoquinoline ring, quinoline ring, naphthyridine ring, phthalazine ring, quinoxaline ring, quinazoline ring, cinnoline ring, pteridine ring, acridine ring, perimidine ring, phenanthroline ring, carbazole ring, carboline ring, phenazine ring, anthyridine ring, thiadiazole ring, oxadiazole ring, triazine ring, triazole ring, tetrazole ring, benzimidazole ring, banzoxazole ring, benzothiazole ring, benzothiadiazole ring, benzofuroxan ring, naphthoimidazole ring, benzotriazole ring and tetraazaindene ring; and preferable examples are triazole ring and tetrazole ring.

Examples of substituents that can be attached to the heterocyclic ring will be described below.

Examples of the substituents that can be introduced into the heterocyclic compounds used in the invention are listed below, but are not restricted thereto.

Examples of the substituents that can be attached to the heterocyclic ring include a halogen atom, an alkyl group (linear, branched or cyclic alkyl group that may be a polycyclic alkyl group such as a bicyclo alkyl group, or a group containing an active methine group), an alkenyl group, an alkynyl group, an aryl group, and amino group and a heterocyclic group.

At least two substituents of a plurality of substituents may be linked to one another to form a ring, for example may form an aromatic ring, an aliphatic hydrocarbon ring or a heterocyclic ring, and these rings may further be combined to one another to form polycyclic condensed ring. Examples thereof include benzene ring, naphthalene ring, anthracene ring, pyrrole ring, furan ring, thiophene ring, imidazole ring, oxazole ring and thiazole ring.

Examples of the heterocyclic compound that can be particularly preferably used in the invention include those described below, but are not restricted thereto.

Examples thereof include 1,2,3,4-tetrazole, 5-amino-1,2, 3,4-tetrazole, 5-methyl-1,2,3,4-tetrazole, 1,2,3-triazole, 4-amino-1,2,3-triazole, 4,5-diamino-1,2,3-triazole, 1,2,4-triazole, 3-amino-1,2,4-triazole, 3,5-diamino-1,2,4-triazole and benzotriazole.

Each of the heterocyclic compounds used in the invention may be used alone, or at least two of them may be used together.

While the heterocyclic compound used in the invention can be synthesized by a conventional method, commercially available products may be used.

The total addition amount of the heterocyclic compound used in the invention is preferably in the range from 0.01 to 0.10% by mass, more preferably in the range from 0.03 to 0.10% by mass, and further preferably in the range from 0.04 to 0.08% by mass based on the amount of the polishing liquid used for polishing (that is, the amount of the polishing liquid after diluting when diluted with water or with an aqueous solution; the same will be applied to the "polishing liquid used for polishing" hereafter).

[Polishing Particles Containing Silicon Oxide]

Oxides of silicon and composite particles thereof can be used as polishing particles in the polishing liquid of the invention. Examples of the oxides of silicon include colloidal silica, fumed silica and plasma fused silica. Examples of the composite particles include core-shell particles containing the above-described silica and composite particles wherein guest particles are attached on the surface of core particles.

Examples of the composite particles containing silicon oxide include those having a core-shell structure in which silicon oxide particles are coated on the surface of core particles made of another material, those prepared by adhering silicon oxide particles on the surface of the core particles, and those comprising a plurality of materials in which some of the materials are enclosed in particles of the other materials. For example, these composite particles may be produced by a method for forming silicon oxide particles by a well known hydrolysis method of alkoxy silane using commercially available particles as cores.

The polishing particles preferably have a primary particle diameter, which is determined by converting the specific surface area of the particles into a true sphere particle model according to BET method, of from 15 to 70 nm. The polishing particles are preferably colloidal silica having the above-mentioned particle diameter, or composite particles containing at least colloidal silica.

The particle diameter of the polishing particles can be calculated from the following equation. When the primary particle is assumed to be an ideal sphere, the relation represented by the following equation is approximately satisfied between the specific surface area SSA, and the surface area S, volume V and density ρ of one particle.

$$SSA = 1/(V \cdot \rho) \times S$$

Since V and S are physical values unambiguously determined from the particle diameter, the particle diameter can be determined from the specific surface area and density. The density can be easily determined using a commercially available pycnometer. The specific surface area SSA can be easily determined using commonly used specific surface area measurement apparatus according to BET method (such as TriStar 3000 manufactured by Simadzu Corporation.). In the invention, the primary particle diameter is calculated from these values.

The polishing particles containing silicon oxide can be obtained by a well known method. In a wet process for producing metal oxide particles, colloidal particles are obtained by hydrolysis of a metal alkoxide as a starting material. In a specific example, methyl orthosilicate is added dropwise to an aqueous alkaline solution mixed with an alcohol at a given speed to allow methyl orthosilicate to be hydrolyzed, and colloidal silica is produced via a period for allowing the particles to grow and via a period for stopping growth of the particles by quenching.

In another method, colloid particles are formed using alkoxides of aluminum and titanium. Since the hydrolysis rate is usually higher in this case than using silicon alkoxide, this method is advantageous for producing ultra-fine particles.

In a dry process of metal oxides, a metal chloride is introduced into oxy-hydrogen flame, and a de-chlorinated metal is oxidized to form fumed particles. In another practically used method, a metal or an alloy to be included in a final product is pulverized into a powder, introduced into oxygen flame containing a combustion-supporting gas, and continuously reacted by the heat of oxidation of the metal to form fine oxide particles. Particles produced by these combustion methods become amorphous through the high temperature process. In addition, the density of the solid is usually high since the particles contain a smaller amount of impurities such as hydroxyl groups within the particles as compared with the particles produced by the wet process. Further, the density of hydroxyl groups on the surface of the particles is low.

Only one kind of the polishing particles containing silicon oxide may be used in the invention, or plural kinds of particles may be combined for use. While the content of the polishing particles in the polishing liquid is appropriately selected depending on the object, it is preferable in the range from 0.01 to 20% by mass, more preferably in the range from 0.1 to 10% by mass.

[Oxidizing Agent]

The polishing liquid of the invention may contain a compound capable of oxidizing the metal to be polished (an oxidizing agent).

Examples of the oxidizing agent include hydrogen peroxide, peroxides, nitrate salts, iodate salts, periodate salts, hypochlorite salts, chlorite salts, chlorate salts, perchlorate salts, persulfate salts, bichromate salts, permanganate salts, aqueous ozone, silver (II) salts and iron (III) salts.

Inorganic iron (III) salts such as iron (III) nitrate, iron (III) chloride, iron (III) sulfate and iron (III) bromide as well as organic complexes of iron (III) are preferably used as the iron (III) salts.

The addition amount of the oxidizing agent can be controlled according to the amount of dishing at the initial stage of barrier metal CMP. When the amount of dishing at the initial stage of barrier metal CMP is large, that is, when the wiring material is not desired to be polished so much during barrier metal CMP, the addition amount of the oxidizing agent is desirably small, while the addition amount of the oxidizing agent is desirably increased when the amount of dishing at the initial stage of barrier metal CMP is small and the wiring material is to be polished at a high speed. Since it is desirable to change the addition amount of the oxidizing agent depending on the dishing conditions at the initial state of barrier metal CMP, the content of the oxidizing agent in 1 L of the polishing liquid is preferably in the range from 0.01 to 1 mole, particularly in the range from 0.05 to 0.6 moles.

The polishing liquid of the invention may contain other components, and examples of the preferable component include polishing particles, compounds added as a so-called film-forming agent, surfactants, water soluble polymers and other additives.

The polishing liquid may contain either one or a plurality of components.

The oxidizing agent may be added to the composition containing other components immediately before use to prepare the polishing liquid.

The term "polishing liquid" in the invention means a polishing liquid to be directly used for polishing (that is, diluted polishing liquid as necessary) or a concentrated liquid of the polishing liquid. The concentrated liquid or concentrated polishing liquid means a polishing liquid prepared to have a higher concentration than that of the polishing liquid to be directly used for polishing, and is used for polishing after diluting with water or with an aqueous solution. The dilution factor is usually in the range from 1 to 20 times by volume. The terms "concentrated" and "concentrated liquid" as used in this specification are used according to idiomatic expressions meaning that the liquid is "denser" and "a denser liquid" than the liquid to be directly used, and are used in a different meaning from conventional terms meaning a liquid that has been subjected to a physical concentration operation such as evaporation.

[pH Control Agent]

The polishing liquid of the invention has a pH in the range from 2.0 to 6.0, preferably in the range from 2.4 to 5.5. An alkali/acid or a buffer agent is used for controlling the pH in a desirable range. The polishing liquid of the invention exhibits excellent effects in the above-mentioned pH range.

Preferable examples of the alkali/acid or buffer agent include non-metallic alkali agents including ammonium hydroxide, organic ammonium hydroxide such as tetramethyl ammonium hydroxide, and alkanol amines such as diethanol amine, triethanol amine and triisopropanolamine; alkali metal hydroxides such as sodium hydroxide, potassium hydroxide and lithium hydroxide; inorganic acids such as nitric acid, sulfuric acid and phosphoric acid; carbonate salts such as sodium carbonate; phosphoric salts such as trisodium phosphate; borate salts, tetraborate salts and hydroxybenzoate salts. Ammonium hydroxide, potassium hydroxide, lithium hydroxide and tetramethyl ammonium hydroxide are particularly preferable alkali agents.

The addition amount of the alkali/acid or buffer agent may be an amount such that the pH is maintained within the preferable range and the electric conductivity is below the afore-mentioned level. The amount is preferably in the range from 0.0001 to 1.0 mole, more preferably in the range from 0.003 to 0.5 moles, in 1 L of the polishing liquid used for polishing.

[Chelating Agent]

The polishing liquid of the invention preferably contains a chelating agent (a so-called hard water softening agent) in order to reduce adverse effects of mingled polyvalent metal ions, as needed.

The chelating agent may be a general-purpose hard water softening agent and related compounds thereof as a precipitation-preventing agent of calcium and magnesium, and examples thereof include nitrilotriacetic acid, diethylenetriamine pentaacetic acid, ethylenediamine tetraacetic acid, N,N,N-trimethylene phosphoric acid, ethylenediamine-N,N,N',N'-tetramethylene sulfonic acid, trans-cyclohexanediamine tetraacetic acid, 1,2-diaminopropane tetraacetic acid, glycoletherdiamine tetraacetic acid, ethylenediamine ortho-hydroxyphenyl acetic acid, ethylenediamine disuccinic acid (SS-isomer), N-(2-carboxylate ethyl)-L-aspartic acid, β-alanine diacetic acid, 2-phosphonobutane-1,2,4-tricarboxylic acid, 1-hydroxyethylidene-1,1-diphosphonic acid, N,N'-bis(2-hydroxyvenzyl)ethylenediamine-N,N'-diacetic acid and 1,2-dihydroxybenzene-4,6-disulfonic acid.

A plurality of chelating agents may be used together, if necessary.

The addition amount of the chelating agent may be an amount enough for blocking metal ions such as mingled polyvalent metal ions. For example, the chelating agent is added in an amount of from 0.0003 moles to 0.07 moles in 1 L of the polishing liquid used for polishing.

[Additives]

The following additives are preferably used in the polishing liquid of the invention:

ammonia; alkyl amines such as dimethylamine, trimethylamine, triethylamine and propylenediamine; amines such as ethylenediamine tetraacetic acid (EDTA), sodium diethyldithiocarbamate and chitosane; imines such as dithizone, cuproin (2,2'-biquinoline), neocuproin (2,9-dimethyl-1,10-phenanthroline), bathocuproin (2,9-dimethyl-4,7-diphenyl-1,10-phenanthroline) and cuperazone (bis-cyclohexanone oxarylhydrazone); mercaptans such as nonyl mercaptan, dodecyl mercaptan, triazine thiol, triazine dithiol and triazine trithiol; and L-tryptophan and cuperazone.

Chitosane, ethylenediamine tetraacetic acid, L-triptophan, cuperazone and triazine dithiol are preferable among them for making a high CMP speed and low etching speed compatible.

The addition amount of the additive is preferably in the range from 0.0001 mole to 0.5 moles, more preferably in the range from 0.001 mole to 0.2 moles, and particularly in the range from 0.005 moles to 0.1 mole in 1 L of the polishing liquid used for polishing. In other word, the addition amount of the additive is preferably 0.0001 mole or more for suppressing etching, but preferably 0.5 moles or less for preventing the CMP speed from decreasing.

[Surfactant/Hydrophilic Polymer]

The polishing liquid of the invention preferably contains a surfactant and hydrophilic polymer.

Both the surfactant and hydrophilic polymer decrease the contact angle of the surface to be polished to enhance uniform polishing. The surfactant and hydrophilic polymer used are favorably selected from the following groups.

Examples of anionic surfactants include carboxylate salts, sulfonate salts, sulfuric acid ester salts and phosphoric acid ester salts; examples of cationic surfactants include aliphatic amine salts, aliphatic quaternary ammonium salts, benzalkonium chloride salts, benzethonium chloride salts, pyridinium salts and imidazolinium salts; examples of amphoteric surfactants include carboxybetaine surfactants, aminocarboxylate salts, imidazolinium betaine, lecithin and alkylamine oxide; and examples of nonionic surfactants include ether type, ether ester type, ester type and nitrogen-containing surfactants. Fluorine-containing surfactants are also available.

Examples of hydrophilic polymer include polyglycols such as polyethylene glycol, polyvinyl alcohol, polyvinyl pyrrolidone, polysaccharides such as alginic acid, and carboxylic acid-containing polymers such as polymethacrylic acid.

The above-mentioned compounds are desirably contained as acids or ammonium salts thereof in order to eliminate contamination by alkali metals, alkali earth metals and halogen compounds. Cyclohexanol, ammonium polyacrylate, polyvinyl alcohol, succinamide, polyvinyl pyrrolidone, polyethyleneglycol, polyoxyethylene polyoxypropylene block polymer are more preferable among the above-exemplified compounds.

These surfactants and hydrophilic polymers have a weight average molecular weight preferably in the range from 500 to 100,000, particularly in the range from 2,000 to 50,000.

Among the components added for preparing a concentrated liquid of the polishing liquid, the blending amount of the component having a solubility of 5% or less in water at room temperature is preferably at most 2 times, and more preferably at most 1.5 times the solubility in water at room temperature in order to prevent the component from precipitating when the concentrated liquid is cooled to 5° C.

The polishing liquid of the invention is suitable for polishing the barrier metal layer provided for preventing diffusion of copper interposed between the wiring line composed of metallic copper and/or copper alloy and interlayer insulation film.

A low resistance metal material is suitable for the material of the barrier metal layer. Preferable examples thereof include tantalum (Ta), tantalum nitride (TaN), titanium (Ti), titanium nitride (TiN), titanium tungsten (TiW), tungsten (W), tungsten nitride (WN), nickel (Ni), nickel nitride (NiN), ruthenium (Ru) and combinations thereof. Among them, tantalum (Ta) and tantalum nitride (TaN) are particularly preferable.

[Wiring Metal Material]

In the invention, the semiconductor is preferably an LSI comprising wiring lines made of metallic copper and/or a copper alloy, and particularly preferably of a copper alloy. A copper alloy containing silver is more preferable among the copper alloys. The content of silver in the copper alloy is preferably 40% by mass or less, more preferably 10% by mass or less, and particularly 1% by mass or less. The polishing liquid of the invention exhibits most excellent effect to the copper alloy containing silver in the range from 0.00001 to 0.1% by mass.

[Thickness of Wiring]

The semiconductor to be polished according to the invention is preferably an LSI having wiring lines with a half pitch of 0.15 μm or less, particularly 0.10 μm or less and further preferably 0.08 μm or less in DRAM devices, and an LSI having wiring lines with a half pitch of 0.12 μm or less, particularly 0.09 μm or less and further preferably 0.07 μm or less in MPU devices. The polishing liquid of the invention exhibits a particularly excellent effect for these LSIs.

[Polishing Method]

The polishing liquid may be a concentrated liquid that is used by diluting with water; a polishing liquid wherein each component is in a form of aqueous solution as will be described below, and is used by mixing and diluting with water if necessary; or a polishing liquid that has been already prepared as directly available polishing liquid. The polishing method using the polishing liquid of the invention is not particularly restricted, and may be applied in any above-mentioned cases. The polishing liquid is mainly employed in a polishing method in which the polishing liquid is supplied to a polishing pad on a polishing platen, and the polishing is performed by putting the polishing pad in contact with the polishing surface while the polishing surface and polishing pad are made to relatively move. The polishing liquid of the invention is particularly suitable for polishing a barrier metal material.

A conventionally used polishing apparatus having a holder for holding a semiconductor substrate having a polishing surface and a polishing platen on which the polishing pad is attached is available as the polishing apparatus. The polishing platen is connected to a rotation speed-variable motor. Conventionally used nonwoven fabric, polyurethane foam and porous fluorinated resin may be used for the polishing pad, and the material for the polishing pad is not particularly restricted. While the polishing condition is not particularly restricted, a low rotation speed of the polishing platen of 200 rpm or less is preferable so that the substrate does not fall out of the pad. The pressure for compressing the semiconductor substrate having the polishing surface (polishing film) onto the polishing pad is preferably in the range from 5 to 500 $g/cm^2$, and a pressure in the range from 12 to 240 $g/cm^2$ is more preferable for satisfying uniformity of the polishing speed on the wafer surface and planarity of the pattern.

The polishing liquid is continuously supplied to the polishing pad using a pump and the like during polishing. While the amount of the supply is not restricted, it is preferable to always cover the surface of the polishing pad with the polishing liquid. The semiconductor substrate after polishing is thoroughly cleaned with running water, and is dried after sweeping water droplets adhered on the semiconductor substrate using a spin dryer. In the polishing method of the invention, the aqueous solution used for dilution is the same as the aqueous solution described below. The aqueous solution contains at least one of oxidizing agents, acids, additives and surfactants, and the combined components of the components contained in the aqueous solution and the components of the polishing liquid to be diluted are adjusted to be the components for polishing using the polishing liquid. When the polishing liquid is used after being diluted with the aqueous solution, a more concentrated polishing liquid can be prepared because components having low solubility are dissolved in the aqueous solution.

In an embodiment, for diluting the concentrated polishing liquid with water or an aqueous solution, both the liquids are mixed by using a pipe for feeding the concentrated polishing liquid and a pipe for feeding water or the aqueous solution, which pipes are merged together, and then the resulting mixed and diluted polishing liquid is supplied to the polishing pad. Available mixing methods include conventionally used mixing methods such as a method of mixing by collision of liquids comprising allowing the liquids to pass through narrow passageways under pressure; a method comprising repeating diffluence and confluence of the liquids by packing the pipe with fillers such as glass tubes; and a method comprising providing blades rotating with a power in the pipe.

The feed rate of the polishing liquid is preferably in the range of 10 to 1000 ml/min, and a rate of 170 to 800 ml/min is more preferable for satisfying uniform polishing speed on the surface of the wafer and planarity of the pattern.

In an embodiment, for polishing by diluting the concentrated polishing liquid with water or an aqueous solution, a pipe for feeding the polishing liquid and a pipe for feeding water or the aqueous solution are independently provided, predetermined amounts of the respective liquids are supplied to the polishing pad, and mixing of the liquids and polishing are simultaneously performed by relative movement between the polishing pad and polished surface. In another embodiment, predetermined amounts of the concentrated polishing liquid and water or an aqueous solution are filled in a vessel and mixed, and the resulting mixed polishing liquid is fed to the polishing pad to perform polishing.

In another polishing method using the polishing liquid of the invention, components to be contained in the polishing liquid are separated into at least two constituents, these constituents are supplied onto the polishing pad on the polishing platen by diluting with water or aqueous solution immediately before use, and the polishing pad is made to contact the surface to be polished to polish the surface by relative movement between them.

For example, an oxidizing agent as a constituent (A), and an acid, an additive, a surfactant and water as a constituent (B) are each used by diluting with water or an aqueous solution.

Alternatively, additives having low solubility are divided into constituents (A) and (B), where the former comprises an oxidizing agent, an additive and a surfactant while the latter comprises an acid, an additive, a surfactant and water. The constituent (A) and constituent (B) are diluted by adding water or an aqueous solution immediately before use. Three pipes for feeding a constituent (A), a constituent (B) and water or an aqueous solution, respectively, are required in this case. While the three pipes may be joined into one pipe for mixing the constituents therein and for feeding the mixed constituents to the polishing pad, it is possible to merge two pipes together in advance and then join it to the other pipe.

In this method, for example, after ensuring a long dissolution time by elongating the mixing passageway for mixing the constituent containing an additive having low solubility and other constituents, the pipe is joined to the other pipe for water or an aqueous solution. In other mixing methods, three pipes are directly guided to the polishing pad to mix the liquids from the respective pipes on the surface of the pad by relative movement of the polishing pad and polished surface as described above, or three constituents are mixed in a vessel to feed the diluted polishing liquid therefrom to the polishing pad. In any of the above-mentioned polishing methods, one constituent containing an oxidizing agent is maintained at 40° C. or less while the other constituents are warmed at a temperature in the range from room temperature to 100° C., and the mixed liquid may be adjusted to 40° C. or less when one constituent and the other constituents are used by diluting with water or an aqueous solution. Since the higher temperature increases the solubility, this method is preferable for increasing the solubility of the materials having low solubility in the polishing liquid.

Constituents other than the oxidizing agent dissolved by heating at a temperature in the range from room temperature to 100° C. may be precipitated in solution when the temperature is lowered. Therefore, when the constituents are used once the temperature is lowered, the precipitated constituents should be dissolved by heating. For this purpose, means for feeding a liquid containing a constituent dissolved therein by heating, or means for stirring a liquid containing precipitates, feeding the liquid through a pipe, and heating the pipe to dissolve the precipitates may be used. When the temperature of the constituent containing an oxidizing agent is increased to 40° C. or more due to the heated constituent, the oxidizing agent may be decomposed. Therefore, it is preferable that the temperature after mixing the heated constituent and the constituent containing the oxidizing agent is adjusted to less than 40° C.

The component of the polishing liquid may be supplied to the polishing surface after dividing the component into plural components. In this case, the component is preferably supplied by dividing into a component containing an oxidizing agent and a component containing an acid. Otherwise, the polishing liquid may be used as a concentrated liquid, and dilution water may be separately supplied to the polishing surface.

[Pad]

The polishing pad may be a non-foam pad or a foam pad. A rigid bulk material of a synthetic resin such as a plastic plate may be used for the pad in the former case. In the latter case, an independent foam product (dry foam product), a continuous foam product (wet foam product) and a two-layer composite product (laminated product) may be used, and a two-layer composite product (laminated product) is preferable. Foaming may be uniform or non-uniform.

The polishing pad may contain polishing particles (such as ceria, silica, alumina and resin) used for polishing. While either soft type or hard type polishing particles are available, any of them may be used. Particles having different hardness are preferably used in respective layers of the laminated polishing pad. A non-woven fabric, artificial leather, polyamide, polyurethane, polyester and polycarbonate are preferable materials of the polishing pad. Lattice grooves, pits, concentric grooves or spiral grooves may be formed on the surface of the pad to be in contact with the polishing surface.

[Wafer]

The wafer on which CMP is performed with the polishing liquid of the invention preferably has a diameter of 200 mm or more, particularly 300 mm or more. The invention is highly effective for a wafer having a diameter of 300 mm or more.

(Polishing Apparatus)

While the apparatuses applicable to polishing using the polishing liquid of the invention are not particularly restricted, examples thereof include Mirra Mesa CMP and Reflexion CMP (trade names, manufactured by Applied Materials Inc.), FREX 200 and FREX 300 (trade names, manufactured by Ebara Corp.), NPS 3301 and NPS 2301 (trade names, manufactured by Nikon Corp.), A-FP-310A and A-FP-210A (trade names, manufactured by Tokyo Seimitsu Co., Ltd.), 2300 TERES (trade name, manufactured by Lam Research Co., Ltd.), and Momentum (trade name, manufactured by Speedfam IPEC).

EXAMPLES

While the invention will be described below with reference to examples, the invention is by no means restricted to these examples.

(Polishing Test)

The conditions regarding the material to be polished and the polishing apparatus which were used in the polishing test with the polishing liquid are as follows.

Work: a substrate prepared by performing uniform Cu-CMP to a commercially available patterned wafer on which an insulation film of TEOS, a tantalum barrier layer and copper plating wiring lines were formed until excess copper plating above the insulation layer was completely removed, so that a barrier film was exposed on the surface of the insulation film all over the wafer.

Commercially available patterned wafer: 854 mask pattern wafer (trade name, manufactured by Sematec)

Polishing Pad: IC 1400 (trade name, manufactured by Rohm & Haas Co.)

Polishing apparatus: LPG-612 (trade name, manufactured by Lapmaster)

Pressing load: 14,000 Pa

Polishing liquid feed rate: 200 ml/min

Wafer size: 8 inch

Relative velocity between polishing pad and wafer: 1.0 m/sec (average relative velocity within the wafer surface)

(Evaluation Method)

<Stability of Liquid>

Stability of the polishing liquid was evaluated as follows.

Each polishing liquid in a sample tube was irradiated with a laser light to measure the intensity of the transmitted light.

The intensity of the transmitted light decreases when the particles contained are aggregated, while the intensity is approximately zero when the polishing liquid was gelled.

Evaluation criteria: the sample maintaining an almost the same intensity of the transmitted light for half a year as a standard sample that maintains a high dispersion state for at least half a year was evaluated as "good", and the gelled sample was expressed as "gelled".

<Removability of Barrier Film>

Presence or absence of any residual barrier layer which should be removed on the insulation film on the pattern wafer after barrier metal CMP was confirmed by visual observation, and by observation under an electron microscope and analysis using an X-ray analyzer of 4 chips from the center to the edge of the wafer.

Apparatuses for Evaluation: ultra-high resolution electron microscope+X-ray analyzer, S4800+EDX (trade names, manufactured by Hitachi High-Technologies Corp.)

Evaluation criteria: the case where the metal element used in the barrier material was not detected was designated by "A" and the case where a detection peak of the metal element used in the barrier material was observed was designated by "B" in the element mapping on the insulation film on the pattern wafer by the X-ray analyzer.

<Dishing>

As the amount of dishing (nm), the difference of height between the wiring line (L) and space (S)(L/S=100(μm)/100 (μm)) on the patterned wafer after barrier metal CMP was measured using a profilometer. Three chips aligned at constant intervals in the radius direction of the patterned wafer were measured, and the average value thereof was used.

Apparatus for Evaluation: contact type profilometer, Dektak V320 (trade name, manufactured by Veeco)

Examples 1 to 8, Comparative Examples 1 to 3

(Preparation of Polishing Liquid for Barrier Metal Material)

Solvent: ultra-pure water

Oxidizing agent: hydrogen peroxide (manufactured by Wako Pure Chemical Industries, Ltd.), Addition amount: 20 g/L Monocarboxylic acid (compounds shown in Table 1), Addition amount: 0.2 mol/L Polishing particles: silicon oxide particles (colloidal silica, average particle diameter: 48 nm), Addition amount: 5.0% by mass Heterocyclic compound: (compounds shown in Table 1), Addition amount: 0.5 to 0.75 g/L (Content based on the polishing liquid composition: 0.01 to 0.10% by mass)

pH: appropriately adjusted using an acid or alkali so as to be the pH shown in Table 1

Polishing liquids in Examples 1 to 8 and Comparative Examples 1 to 3 were prepared using the monocarboxylic acids and heterocyclic compounds shown in Table 1. The pH of each liquid was adjusted to the pH shown in Table 1 using buffer. The electric conductivity of each polishing liquid is shown in Table 1.

The stability of the liquid, removability of the barrier film and dishing were measured by the evaluation methods by the above-mentioned experiments using these polishing liquids. The results are also shown in Table 1.

TABLE 1

| | Monocarboxylic Acid | Heterocyclic Compound | pH | Electric Conductivity (mS/cm) | Stability of Liquid | Removability of Barrier Film | Dishing (nm) |
|---|---|---|---|---|---|---|---|
| EXAMPLE 1 | Lactic Acid | Benzotriazole | 3.7 | 4.7 | Good | A | 22 |
| EXAMPLE 2 | Glycolic Acid | Triazole | 3.0 | 3.7 | Good | A | 30 |
| EXAMPLE 3 | Acetic Acid | Tetrazole | 4.2 | 5.5 | Good | A | 26 |
| EXAMPLE 4 | Butyric Acid | Benzotriazole | 5.5 | 7.1 | Good | A | 32 |
| EXAMPLE 5 | Methyl Valeric Acid | Benzotriazole | 2.4 | 2.8 | Good | A | 36 |
| EXAMPLE 6 | Propionic Acid | Benzotriazole | 4.5 | 6.1 | Good | A | 35 |
| EXAMPLE 7 | Mandelic Acid | Methyl Tetrazole | 3.2 | 4.2 | Good | A | 44 |
| EXAMPLE 8 | Capronic Acid | Methyl Triazole | 5.0 | 6.3 | Good | A | 41 |
| COMPARATIVE EXAMPLE 1 | Lactic Acid | Benzotriazole | 7.0 | 20 | Gelled | — | — |
| COMPARATIVE EXAMPLE 2 | Butyric Acid | Benzotriazole | 7.2 | 22 | Gelled | — | — |
| COMPARATIVE EXAMPLE 3 | Glycine | Benzotriazole | 4.5 | 8 | Good | B | 135 |

As shown in Table 1, the polishing liquids for barrier metal materials of Examples 1 to 8, which contained the monocarboxylic acids represented by the formula (1), silicon oxide particles and water, had a pH adjusted in the range from 2.0 to 6.0, and had an electric conductivity adjusted to 10 mS/cm or less, were excellent in storage stability without being gelled due to liquid unstability. It was also shown that barrier metal can be effectively removed and dishing can be effectively alleviated in CMP of the semiconductor device.

The present invention provides at least the following embodiments 1 to 14.

1. A polishing liquid for polishing a barrier metal material on an interlayer insulation material, the polishing liquid having a pH of from 2.0 to 6.0 and comprising an aqueous solution containing a compound represented by the following formula (1), and polishing particles containing silicon oxide and dispersed in the aqueous solution:

wherein $m+n \leqq 4$; $R^1$ represents a hydrogen atom, a methyl group, an ethyl group or a hydroxyl group; $R^2$ represents a methyl group, an ethyl group, a benzene ring or a hydroxyl group; and when a plurality of $R^2$s are present in the formula (1), they are the same or different from one another.

2. The polishing liquid according to embodiment 1, wherein the electric conductivity of the polishing liquid is 10 mS/cm or less.

3. The polishing liquid according to embodiment 1, wherein the compound represented by the formula (1) is selected from the group consisting of lactic acid, glycolic acid, acetic acid, propionic acid, butyric acid, methyl valeric acid, capronic acid and mandelic acid.

4. The polishing liquid according to embodiment 1, wherein the content of the compound represented by the formula (1) is from 0.0005 to 3 mol/L.

5. The polishing liquid according to embodiment 1, further containing a heterocyclic compound.

6. The polishing liquid according to embodiment 5, wherein the content of the heterocyclic compound is from 0.01 to 0.10% by mass.

7. The polishing liquid according to embodiment 5, wherein the heterocyclic compound is selected from the group consisting of 1,2,3,4-tetrazole, 5-amino-1,2,3,4-tetrazole, 5-methyl-1,2,3,4-tetrazole, 1,2,3-triazole, 4-amino-1,2,3-triazole, 4,5-diamino-1,2,3-triazole, 1,2,4-triazole, 3-amino-1,2,4-triazole, 3,5-diamino-1,2,4-triazole and benzotriazole.

8. The polishing liquid according to embodiment 1, wherein the polishing particles have a primary particle diameter, which is determined by converting the specific surface area of the particles into a true sphere particle model, of from 15 to 70 nm.

9. The polishing liquid according to embodiment 1, wherein the polishing particles are colloidal silica or composite particles containing colloidal silica.

10. The polishing liquid according to embodiment 1, wherein the content of the polishing particles is from 0.01 to 20% by mass.

11. The polishing liquid according to embodiment 1, wherein the barrier metal material contains at least one selected from the group consisting of tantalum, tantalum nitride, titanium, titanium nitride, tungsten, tungsten nitride, nickel, nickel nitride, ruthenium and compounds thereof.

12. The polishing liquid according to embodiment 1, further containing an oxidizing agent.

13. The polishing liquid according to embodiment 12, wherein the oxidizing agent contains at least one selected from the group consisting of hydrogen peroxide, peroxides, nitrate salts, iodate salts, periodate salts, hypochlorite salts, chlorite salts, chlorate salts, perchlorate salts, persulfate salts, bichromate salts, permanganate salts, aqueous ozone, silver (II) salts and iron (III) salts.

14. The polishing liquid according to embodiment 12, wherein the content of the oxidizing agent is from 0.01 to 1 mol/L.

What is claimed is:

1. A polishing method comprising polishing a barrier metal material on an interlayer insulation material, the polishing using a polishing liquid, wherein the polishing liquid has a pH of from 2.0 to 6.0 and comprises an aqueous solution containing a compound represented by the following formula (1), the content of the compound in the polishing liquid being from 0.0005 to 3 mol/L, polishing particles containing silicon oxide and dispersed in the aqueous solution, the content of the polishing particles in the polishing liquid being from 0.01 to 20% by mass, and a heterocyclic compound selected from the group consisting of 1,2,3,4-tetrazole, 5-amino-1,2,3,4-tetrazole, 5-methyl-1,2,3,4-tetrazole, 1,2,3-triazole, 4-amino-1,2,3-triazole, 4,5-diamino-1,2,3-triazole, 1,2,4-triazole, 3-amino-1,2,4-triazole, 3,5-diamino-1,2,4-triazole and benzotriazole, the content of the heterocyclic compound in the polishing liquid being from 0.01 to 0.10% by mass:

$$R^1-(CH_2)_m-(CHR^2)_n-COOH \quad (1)$$

wherein $1 \leq m+n \leq 4$; $R^1$ represents a hydrogen atom, a methyl group, an ethyl group or a hydroxyl group; $R^2$ represents a methyl group, an ethyl group, a benzene ring or a hydroxyl group; and when a plurality of $R^2$s are present in the formula (1), they are the same or different from one another;

wherein the electric conductivity of the polishing liquid is from 0.2 to 8.0 mS/cm.

2. The polishing method according to claim 1, wherein the compound represented by formula (1) is a compound selected from the group consisting of lactic acid, glycolic acid, acetic acid, propionic acid, butyric acid, methyl valeric acid, capronic acid and mandelic acid;

3. The polishing method according to claim 1, wherein the polishing particles are colloidal silica or composite particles containing colloidal silica, and have a primary particle diameter, which is determined by converting the specific surface area of the particles into a true sphere particle model, of from 15 to 70 nm.

4. The polishing method according to claim 1, wherein the barrier metal material contains at least one selected from the group consisting of tantalum, tantalum nitride, titanium, titanium nitride, tungsten, tungsten nitride, nickel, nickel nitride, ruthenium and compounds thereof.

5. The polishing method according to claim 1, further containing an oxidizing agent.

6. The polishing method according to claim 5, wherein the oxidizing agent contains at least one selected from the group consisting of hydrogen peroxide, peroxides, nitrate salts, iodate salts, periodate salts, hypochlorite salts, chlorite salts, chlorate salts, perchlorate salts, persulfate salts, bichromate salts, permanganate salts, aqueous ozone, silver (II) salts and iron (III) salts.

7. The polishing method according to claim 5, wherein the content of the oxidizing agent is from 0.01 to 1 mol/L.

8. The polishing method according to claim 1, wherein the polishing liquid has a pH of from 2.4 to 5.5.

* * * * *